United States Patent
Ceballos et al.

(10) Patent No.: US 11,863,196 B2
(45) Date of Patent: Jan. 2, 2024

(54) MICROPHONES WITH AN ON-DEMAND DIGITAL-TO-ANALOG CONVERTER

(71) Applicant: Infineon Technologies AG, Neubiberg (DE)

(72) Inventors: Jose Luis Ceballos, Villach (AT); Christian Reindl, Villach (AT); Christopher Rogi, Klagenfurt (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 81 days.

(21) Appl. No.: 17/457,577

(22) Filed: Dec. 3, 2021

(65) Prior Publication Data

US 2023/0179212 A1   Jun. 8, 2023

(51) Int. Cl.
| | |
|---|---|
| *H03M 1/06* | (2006.01) |
| *H03M 1/10* | (2006.01) |
| *H03M 1/14* | (2006.01) |
| *H03M 1/68* | (2006.01) |
| *H03M 1/00* | (2006.01) |
| *H03M 1/70* | (2006.01) |
| *H03M 1/08* | (2006.01) |
| *H03M 1/80* | (2006.01) |
| *H03M 3/00* | (2006.01) |

(52) U.S. Cl.
CPC ......... *H03M 1/0626* (2013.01); *H03M 1/002* (2013.01); *H03M 1/08* (2013.01); *H03M 1/1009* (2013.01); *H03M 1/14* (2013.01); *H03M 1/68* (2013.01); *H03M 1/70* (2013.01); *H03M 1/802* (2013.01); *H03M 3/464* (2013.01)

(58) Field of Classification Search
CPC .... H03M 1/0626; H03M 1/1009; H03M 1/14; H03M 1/68; H03M 1/802; H03M 3/464; H03M 1/08; H03M 1/70; H03M 1/002
USPC .................................................. 341/143, 155
See application file for complete search history.

(56) References Cited

U.S. PATENT DOCUMENTS

| | | | | |
|---|---|---|---|---|
| 7,061,416 | B2 * | 6/2006 | Nagai | H03M 3/48 |
| | | | | 341/172 |
| 7,629,910 | B2 | 12/2009 | Ramadoss et al. | |
| 10,499,150 | B2 * | 12/2019 | Shajaan | H04R 3/02 |
| 10,944,418 | B2 | 3/2021 | Wang et al. | |
| 2016/0006448 | A1 | 1/2016 | Melanson et al. | |

OTHER PUBLICATIONS

Conzatti, F., et al., "A CT [Delta][Sigma] ADC with 9/50MHz BW Achieving 73/71dB DR Designed for Robust Blocker Tolerance in 14nm FinFET," 43rd IEEE European Solid State Circuits Conference, Sep. 11, 2017, 4 pages.

* cited by examiner

*Primary Examiner* — Khai M Nguyen
(74) *Attorney, Agent, or Firm* — Slater Matsil, LLP (57) ABSTRACT

An analog-to-digital converter (ADC) includes a loop filter having an input for receiving an analog input signal; a quantizer having an input coupled to an output of the loop filter, and an output for providing a digital output signal; and a digital-to-analog converter (DAC) having an input coupled to an output of the quantizer, and an output coupled to the loop filter, wherein the DAC includes at least one always-on DAC element, and a plurality of on-demand DAC elements.

18 Claims, 8 Drawing Sheets

MICROPHONES WITH AN ON-DEMAND
DIGITAL-TO-ANALOG CONVERTER

TECHNICAL FIELD

The present invention relates generally to a microphone with an on-demand Digital-to-Analog Converter (DAC) and a corresponding method.

BACKGROUND

Generally, digital microphones include an analog-to-digital converter (ADC) for converting an analog signal from a micro-electro-mechanical system (MEMS) device into a digital signal. The digital signal also includes noise. There are two types of ADC noise, including quantization noise and thermal noise. Quantization noise is associated with the "rounding error" of the ADC, which is the difference between the analog input signal and a reconstructed digital output signal. The resolution of the ADC can diminish quantization noise. Lower-resolution ADCs will have higher quantization noise than higher-resolution ADCs. Thermal noise is associated with electrical fluctuations arising from the random thermal motion of electrons in various electrical components of the ADC and from a combination of all noise sources other than quantization noise. Thermal noise is observable when the least-significant bit (LSB) of the ADC is small. Thermal noise can be difficult to remove from electrical circuits such as ADCs, and is not diminished by increasing the resolution of the ADC.

SUMMARY

According to an embodiment, an analog-to-digital converter (ADC) includes a loop filter having an input for receiving an analog input signal; a quantizer having an input coupled to an output of the loop filter, and an output for providing a digital output signal; and a digital-to-analog converter (DAC) having an input coupled to an output of the quantizer, and an output coupled to the loop filter, wherein the DAC includes at least one always-on DAC element, and a plurality of on-demand DAC elements.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, a sigma-delta ADC for use in a microphone includes an on-demand DAC, wherein at least one of the DAC elements is always on, and a plurality of the remaining DAC elements are "on-demand," wherein the DAC element is progressively enabled according to a magnitude of the analog input signal presented to the ADC. When the magnitude of the analog input signal is low, one or more of the on-demand DAC elements will be disabled. Disabling the DAC element can include switching off a buffer of the DAC element, or placing the buffer into a low power mode. Disabling the DAC element can also include coupling an output of the DAC element to a common node, so that the thermal noise of the DAC element is not transferred to the output of the DAC, and thus to the output of the ADC, and to the microphone. Enabling the DAC element can include switching on the buffer of the DAC element, or placing the buffer into a normal power mode. Enabling the DAC element can also include decoupling the output the DAC element from the common node, so that the DAC element is a functional element of the DAC. The number of DAC elements that are progressively enabled can correspond to the magnitude of the analog input signal such that a lower magnitude will cause a lower number of DAC elements to be enabled, and a higher magnitude will cause a greater number of DAC elements to be enabled.

According to embodiments, for small signals the ADC will operate in a single bit operational mode, wherein the inner DAC elements (which can also be described as "cells" or "DAC cells") will be toggled. When the input signal is increased, more on-demand DAC elements can be connected to fulfill full-scale specification requirements and to keep the ADC loop stable, as will be described in further detail below. The DAC elements can be driven in a "split-buffer" configuration, allowing not only the DAC element to be disabled, but also the power consumed by buffers of the DAC element to be saved (buffer switched off or placed into a low power mode). Preload conditions can be also applied to the DAC element to diminish dynamic artifacts. The inner DAC elements and the DAC element buffers can be also combined to reduce mismatch effects, which may be important for minimizing ultrasound artifacts in some embodiments. In some embodiments, DAC elements that are not enabled can also be kept switching to maintain dynamic loading conditions without injecting noise into an integrator virtual ground node, which is described below in further detail.

Figure 1:
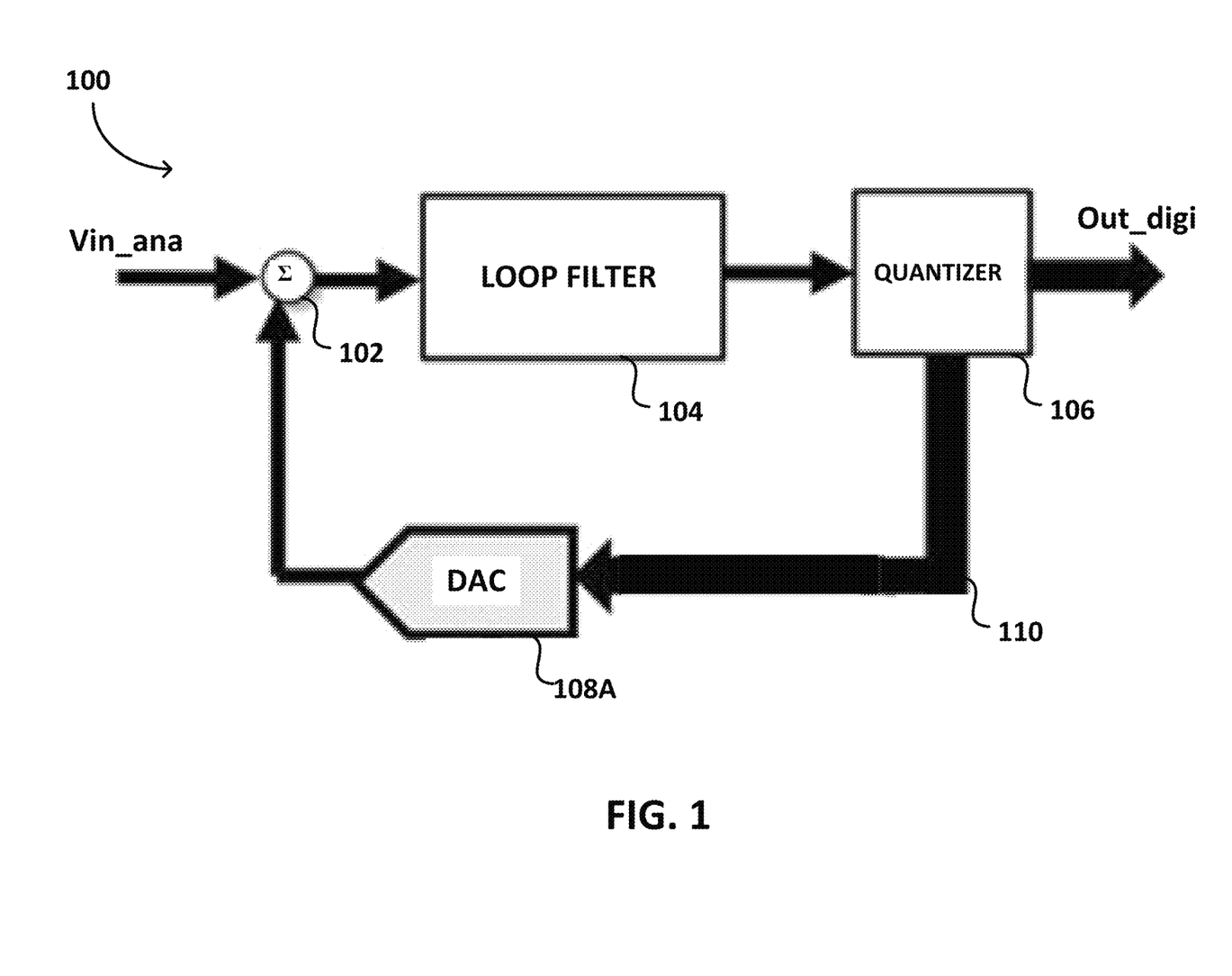
FIG. 1 is a block diagram of an exemplary sigma-delta ADC.

FIG. 1 is a block diagram of an exemplary sigma-delta ADC 100. ADC 100 receives an analog input signal Vin_ana and provides a digital output signal Out_digi. The analog input signal Vin_ana is received by a positive input of summer 102. The output of summer 102 is coupled to a loop filter 104, which may include an integrator and other filtering and noise-shaping circuitry. The output of loop filter 104 is coupled to a quantizer 106, which maps the analog signal at the output of loop filter 104 into a one-bit digital signal. The one-bit digital signal is also received by DAC 108A, which can comprise a one-bit DAC. The output of DAC 108 is coupled to a negative input of summer 102.

Figure 2A:
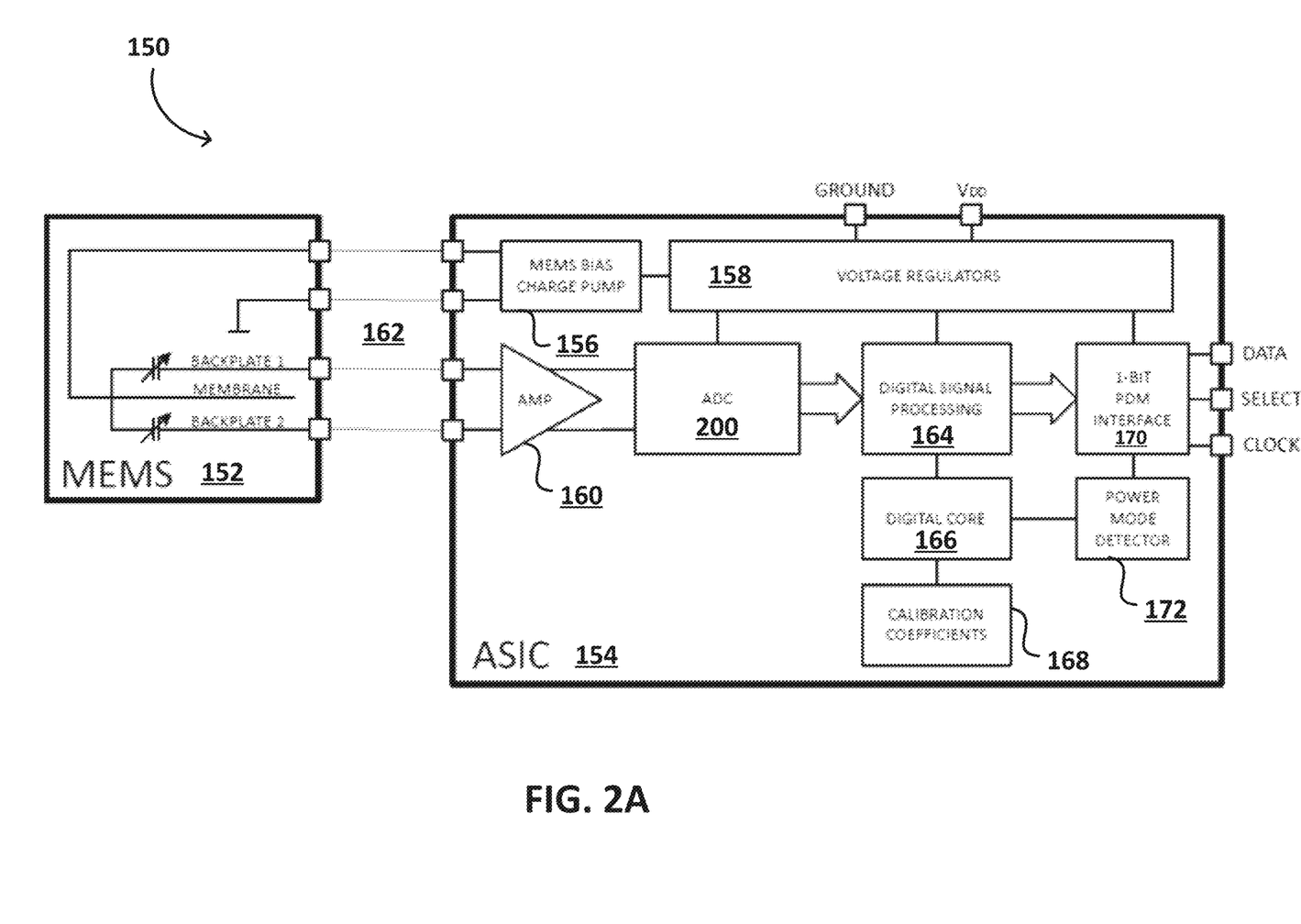
FIG. 2A is a block diagram of digital microphone, according to an embodiment.

FIG. 2A is a block diagram of a digital microphone 150 including a micro-electro-mechanical system (MEMS) device 152 for converting sounds waves into an analog signal, and an Application-Specific Integrated Circuit (ASIC) 154 for receiving the analog signal and for biasing MEMS device 152 through a matching set of MEMS and ASIC pads 162, according to an embodiment. MEMS device 152 can comprise a silicon variable capacitance device, comprising stationary BACKPLATE1 and BACKPLATE2 structures, and a movable MEMBRANE structure, in an embodiment. ASIC 154 comprises a plurality of analog, digital, and mixed signal components, including a programmable gain amplifier (PGA) 160 for amplifying the signal provided by MEMS device, and provides the Vin_ana analog input signal in the digital microphone implementation. ASIC 154 also includes a sigma-delta ADC 200, according to an embodiment, which is described in further detail below. The output of ADC 200 is coupled to additional digital signal processing components in block 164, which is in turn coupled to a 1-bit Pulse-Density Modulation (PDM) interface component 170, which is in turn coupled to the DATA, SELECT, and CLOCK pins of ASIC 154. Digital signal processing block 164 is also coupled to a digital core block 166, which can additional memory and computation circuitry. Storage block 168 includes calibration coefficients to the digital core block 166. ASIC 154 can also include a power mode detector 172 coupled to the digital core block 166 and the 1-bit PDM interface component 170. ASIC 154 also includes a MEMS bias charge pump 156 for biasing MEMS device 152, and a plurality of voltage regulators 158 coupled to the GROUND and VDD ASIC pins, and coupled to various ASIC blocks and components such as ADC 200, digital signal processing block 164, and the 1-bit PDM interface component.

Figure 2B:
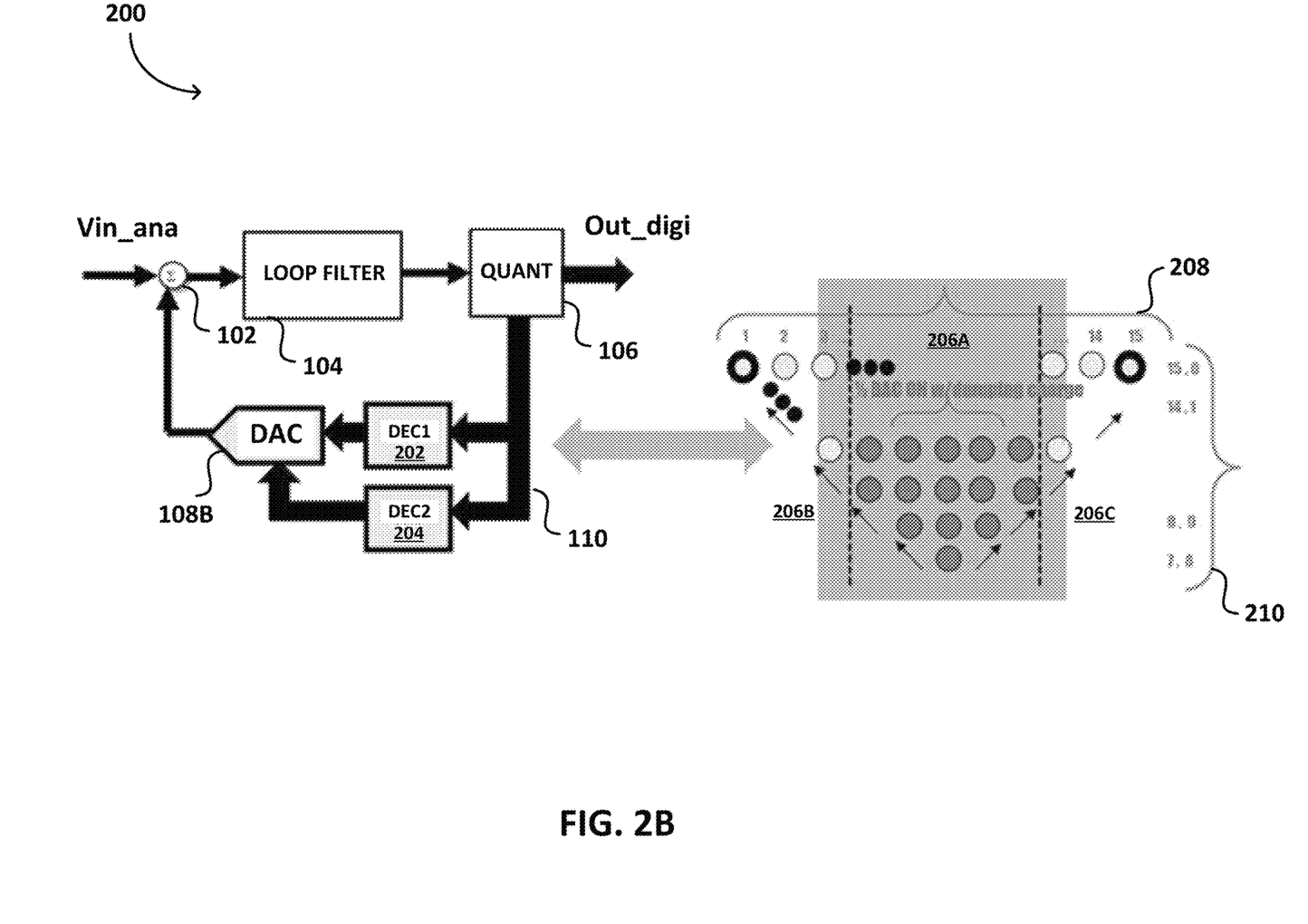
FIG. 2B is a block diagram of a sigma-delta ADC, including a 4-bit DAC with DAC cells that are progressively enabled in response to a digital input code, according to an embodiment.

FIG. 2B includes a block diagram of the sigma-delta ADC 200 in the left portion of the figure. FIG. 2B also includes a diagram of a 4-bit DAC 108B in the right portion of the figure. DAC 108B comprises a plurality of DAC cells in location 206B and location 206C that are progressively enabled in response to a digital input code (1, 2, 3, . . . 14, 15), including improvements directed to noise reduction and/or power savings with respect to prior art sigma-delta ADCs, according to an embodiment. An individual DAC cell is represented as a circle in FIG. 2B. For some digital input codes all of the DAC cells are enabled. For example, in the top row all available DAC cells are enabled (corresponding to code {15, 0}) and thus the entire row of DAC cells are represented by circles. For other digital input codes a subset of the DAC cells are enabled. For example, in the bottom row only one of the available DAC cells is enabled (corresponding to code {7,8}) and thus only one DAC cell is represented by a circle.

ADC 200 receives the analog input signal Vin_ana (from PGA 160 shown in FIG. 2A) and provides the digital output signal Out_digi (at the DATA pin shown in FIG. 2A). The analog input signal Vin_ana is received by a positive input of summer 102. The output of summer 102 is coupled to a loop filter 104, which may include an integrator and other filtering and noise-shaping circuitry. The output of loop filter 104 is coupled to a quantizer 106, which maps the analog signal at the output of loop filter 104 into a multi-bit digital signal. The multi-bit digital signal is also received a first decoder 202 and a second decoder 204. The first decoder 202 can comprise an optional binary-to-thermometer code decoder, and the second decoder 204 can comprise DAC logic for controlling switches in a plurality of on-demand DAC elements, which will be described in further detail below, particularly with respect to the descriptions of FIG. 5 and FIG. 6. The input of DAC 108A, which can comprise a four-bit DAC in some embodiments, is modified according to embodiments and also described in further detail below with respect to the descriptions of FIG. 5 and FIG. 6. Alternatively, DACs having other resolutions can also be used. The output of DAC 108 is coupled to a negative input of summer 102, according to an embodiment. In other embodiments, summer 102 may be merged with loop filter 104.

FIG. 2B shows a diagram representing how the DAC elements are activated with respect to DAC input codes in DAC 108B, as previously described. In embodiments, each DAC element includes a buffer for providing a high impedance input to the DAC element, a capacitor, and a switch matrix to the capacitor. The input to each DAC element receives a single bit of the input digital code, and the output of each DAC element is selectively coupled together to sum the capacitor charge to an output summing node, which, in turn, provides the converted analog output voltage. As described herein, "enabling" a DAC element means placing the buffer of the DAC element into a normal power mode or otherwise turning on the buffer, and/or coupling the DAC element to the output summing node of the DAC. Correspondingly, "disabling" a DAC elements means placing the buffer of the DAC element into a low power mode or otherwise turning off the buffer, and/or decoupling the DAC element from the output summing node of the DAC. The buffer, capacitor, and switch matrix of each DAC element in DAC 108B is shown and described in further detail below, for example with respect to FIG. 4.

FIG. 2B shows at least one always-on DAC element in location 206A, and a plurality of on-demand DAC elements in locations 206B and 206C. In the example of FIG. 2B, five always-on DAC elements are shown, and the remaining DAC elements are on-demand DAC elements. In FIG. 2B, the number of DAC elements that are enabled are shown as an inverted pyramid of DAC elements, from a minimum of one to a maximum of sixteen (for a four-bit DAC). The DAC elements are arranged in three locations: an always-on location 206A, and two on-demand locations 206B and 206C. In an embodiment, locations 206B and 206D are symmetrically arranged on either side of location 206A in a plan view of the DAC layout. In an embodiment, all of the buffers of the DAC elements in the always-on location 206A are turned on, or in a normal power mode. However, not all of the DAC elements are necessarily enabled, depending upon the magnitude of the analog input signal. Thermometer codes 210 are shown for each level of the analog input signal, from code {7,8} through code {0,15}. For example, in response to thermometer codes {7,8}, which corresponds to a minimum level input signal (about 75 µA in an embodiment), only one DAC element is enabled. In another example, in response to thermometers codes {0,15}, which corresponds to a maximum level input signal (about 105 µA in an embodiment), all of the DAC elements are enabled. For intermediate thermometer codes, corresponding to intermediate input signal levels, additional DAC elements are progressively enabled corresponding to the level of the input signal.

Figure 3:
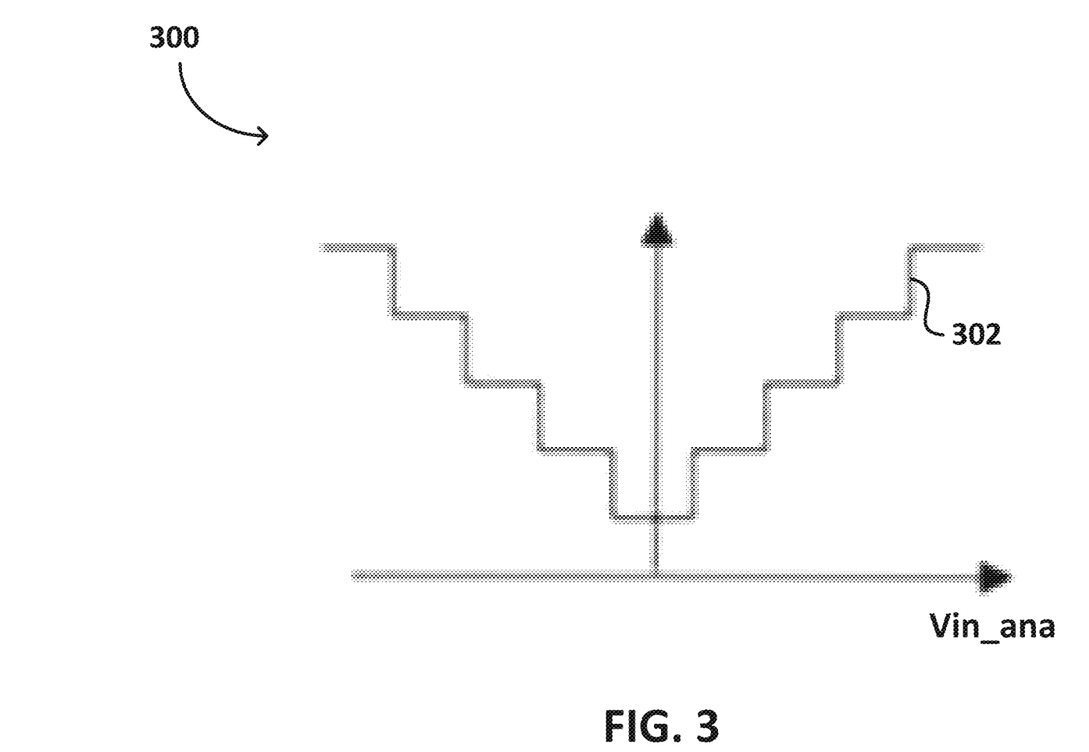
FIG. 3 is graph of the number of DAC cells that are enabled, which increase with the magnitude of an analog input signal.

FIG. 3 is graph 300 of the number of DAC cells that are enabled (in the sense of being decoupled from the DAC output), which increases with the magnitude of an analog input signal. The number of DAC cells to be used is represented by trace 302 for one DAC cell for a minimum input analog signal, to a maximum number of DAC cells for the maximum input analog signal. While trace 302 is shown as representing a linear staircase relationship between the number of DAC cells to be used and the magnitude of the analog input signal, other progressive relationships can also be used.

Figure 4:
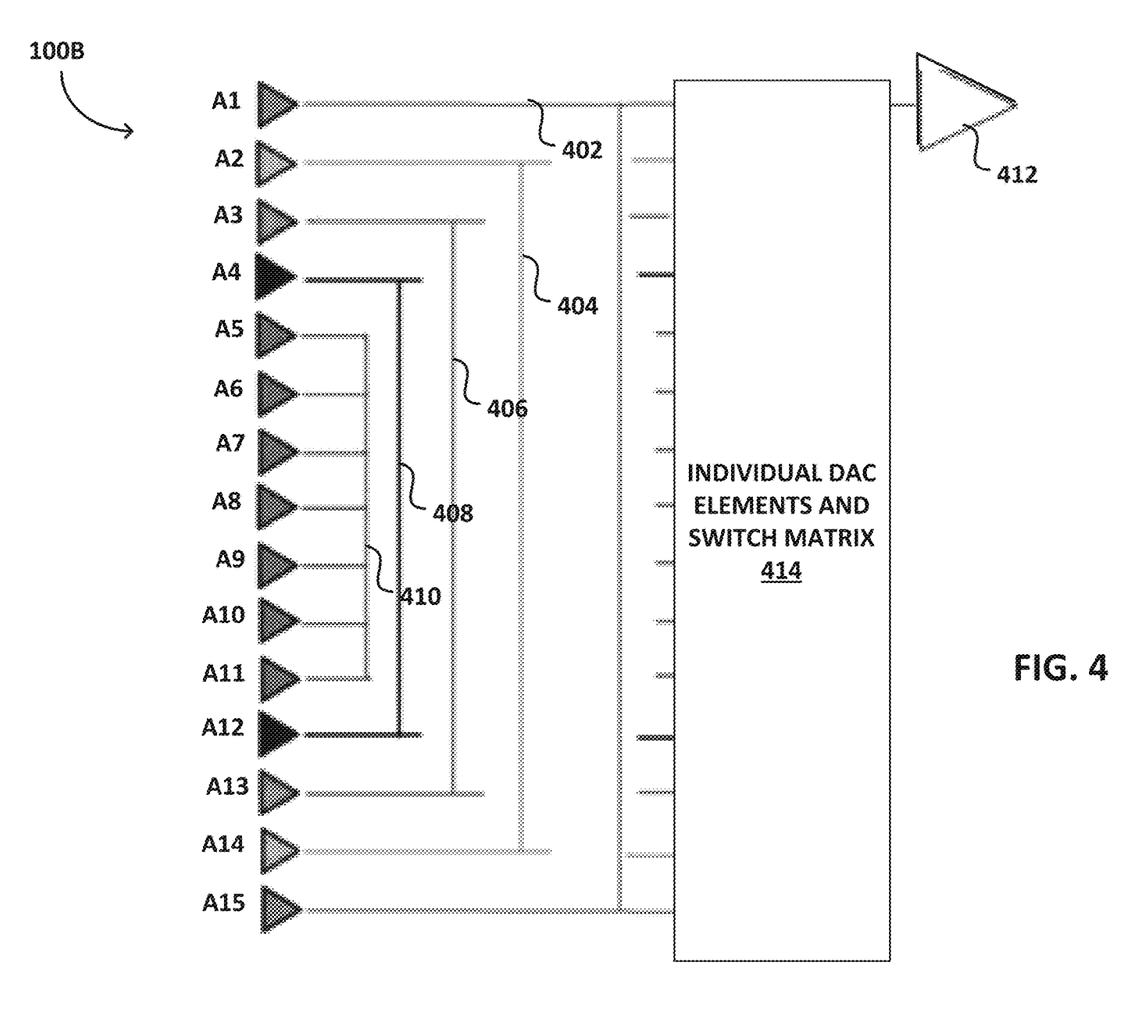
FIG. 4 is a schematic of a portion of an ADC, according to an embodiment, including a plurality of progressively enabled buffers, a block including the progressively enabled 4-bit DAC elements and a switch matrix, and an integrator.

FIG. 4 is a schematic of DAC 100B, which is coupled to integrator 412. DAC 100B was described above with respect to FIG. 2B as including a plurality of DAC elements, wherein each DAC element includes a buffer and a capacitor, wherein the capacitor is coupled to a switch matrix. Integrator 412 (which can be a part of loop filter 104 shown in FIG. 2B) is described in further detail below. DAC 100B includes a plurality of progressively enabled buffers A1, A2, A3, and A4, and symmetrical progressively enabled buffers A12, A13, A14, and A15, and a plurality of always-on buffers A6, A7, A8, A9, A10, and A11. In an embodiment, the outputs of the progressively enabled buffers A1, A2, A3, A4, A12, A13, A14, and A15 are coupled to the outputs of the symmetrical progressively enabled buffers. For example, the output of buffer A3 is coupled to the output of buffer A13. In another example, the output of buffer A2 is coupled to the output of buffer A14. In an embodiment, the outputs of the always-on buffers are coupled together. Five always-on buffers are shown in FIG. 4, but the number of always-on buffer can be changed in other embodiments. At a minimum DAC 100B comprises at least one always-on buffer. DAC 100B also comprises a block including a plurality of progressively enabled 4-bit DAC elements and a switch matrix in block 414. Block 414 comprises portions of the individual DAC elements, which can comprise a capacitor in some embodiments. Block 414 also comprises a plurality of switches coupled to the both ends of the capacitor for selectively coupling the capacitor either to a common node, wherein the thermal noise component is prevented from adding to the output signal of the ADC integrator 412, or to the input of ADC integrator 412. The details of block 414 are shown and described in further detail below, particularly with respect to drawing FIGS. 5 and 6. Integrator 412 is part of loop filter 104, which will be explained in further detail below.

Figure 5:
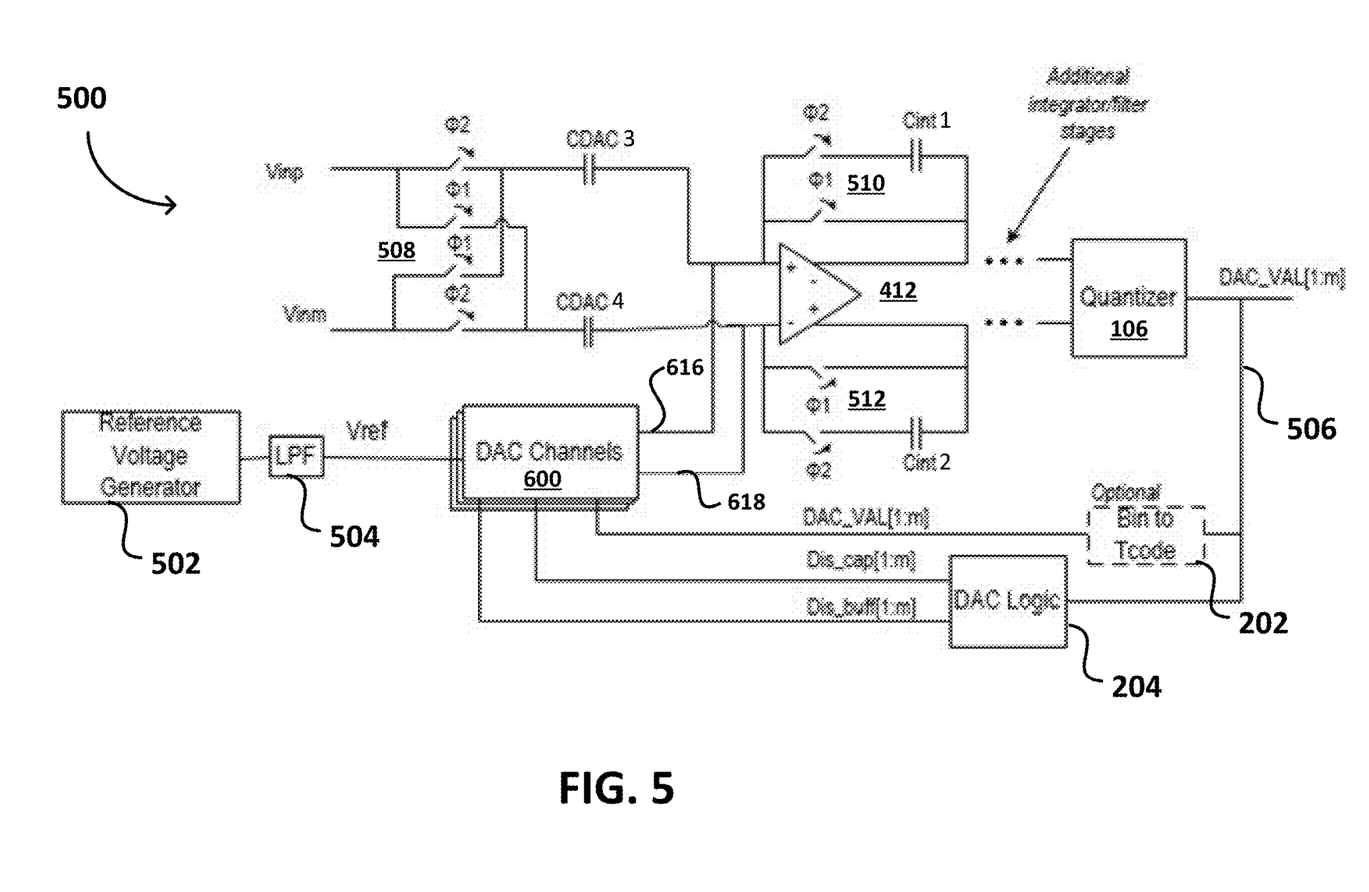
FIG. 5 is a top level block diagram of a differential ADC, according to an embodiment.

FIG. 5 is a top level block diagram of a differential ADC 500, according to an embodiment. ADC 500 includes a reference voltage generator 502, a low pass filter 504 coupled to the output of reference voltage generator 502, and a plurality of DAC channels 600 (described in further detail below with respect to FIG. 6) coupled to circuit nodes 616 and 618. The reference voltage generator 502 can comprise a bandgap reference voltage generator in an embodiment. Low pass filter 504 can comprise either dedicated logic circuitry or software instructions for configuring a microprocessor. In an embodiment, circuit nodes 616 and 618 are the positive and negative inputs, respectively, of integrator 412.

A MEMS device (such as MEMS device 152 shown in FIG. 2A) provides an analog differential signal Vinp and Vinm coupled to a first set of switches 508 controlled by two non-overlapping clock phases φ1 and φ2 to selectively transfer the analog differential signal to the capacitors CDAC3 and CDAC4, respectively, or to capacitors CDAC4 and CDAC3, respectively. Capacitors CDAC3 and CDAC4 are also coupled to circuit nodes 616 and 618. A second set of switches 510 is controlled by the two non-overlapping clock phases φ1 and φ2 to selectively couple the negative output of integrator 412 to the positive input through a first integration capacitor Cint1 or a direct connection. A third set of switches 512 is controlled by the two non-overlapping clock phases φ1 and φ2 to selectively couple the positive output of integrator 412 to the negative input through a second integration capacitor Cint2 or a direct connection. The outputs of integrator 412 are coupled to quantizer 106, previously described with respect to FIG. 2A, through additional integrator and/or filter stages, in some embodiments.

The output of quantizer 106 provides the digital output DAC_VAL[1:m] of ADC 500, which is the digital converted signal corresponding to the analog differential signal Vinp and Vinm. The DAC_VAL[1:m] digital signal, which can comprise a multi-bit digital signal in an embodiment, is fed back to the DAC channels 600 through an optional binary-to-thermometer code converter, which corresponds to the first decoder 202 shown in FIG. 2A. The DAC_VAL[1:m] digital signal is also fed back to the DAC channels 600 through a DAC logic block, which corresponds to the second decoder 204 shown in FIG. 2A. Second decoder 204 generates the Dis_cap[1:m] and Dis_buff[1:m] control signals. The first decoder 202 and second decoder 204 can also comprise either dedicated logic circuitry or software instructions for configuring a microprocessor.

In operation, ADC 500 converts the analog differential signal Vinp and Vinm into a digital output code. However, as previously described, at least some of the DAC elements in DAC channels 600 can be selectively enabled to provide power savings and to provide a reduction in thermal noise appearing in the digital output code. In some embodiments the selective enablement can be performed progressively corresponding to the magnitude of the input analog signal. The power savings is provided by selectively disabling or lowering the power of buffers in the on-demand DAC elements within DAC channels 600. The power reduction is provided by selectively coupling a capacitor in the DAC element to a common node, so that the thermal noise contribution of the capacitor cannot be include in the digital output code. In some embodiments the power savings and noise reduction are combined in a single DAC element. In some embodiments, only the noise reduction is used in a single DAC element. Power reduction and noise reduction are thus two different aspects of the DAC described herein, according to embodiments. The noise is reduced because the capacitor (or DAC element) is disconnected from the output of the DAC, such that the thermal noise of the capacitor does not appear in the signal output. The power savings is realized from shutting down the buffer and stopping the switching and the charging and discharging of the capacitor.

Figure 6:
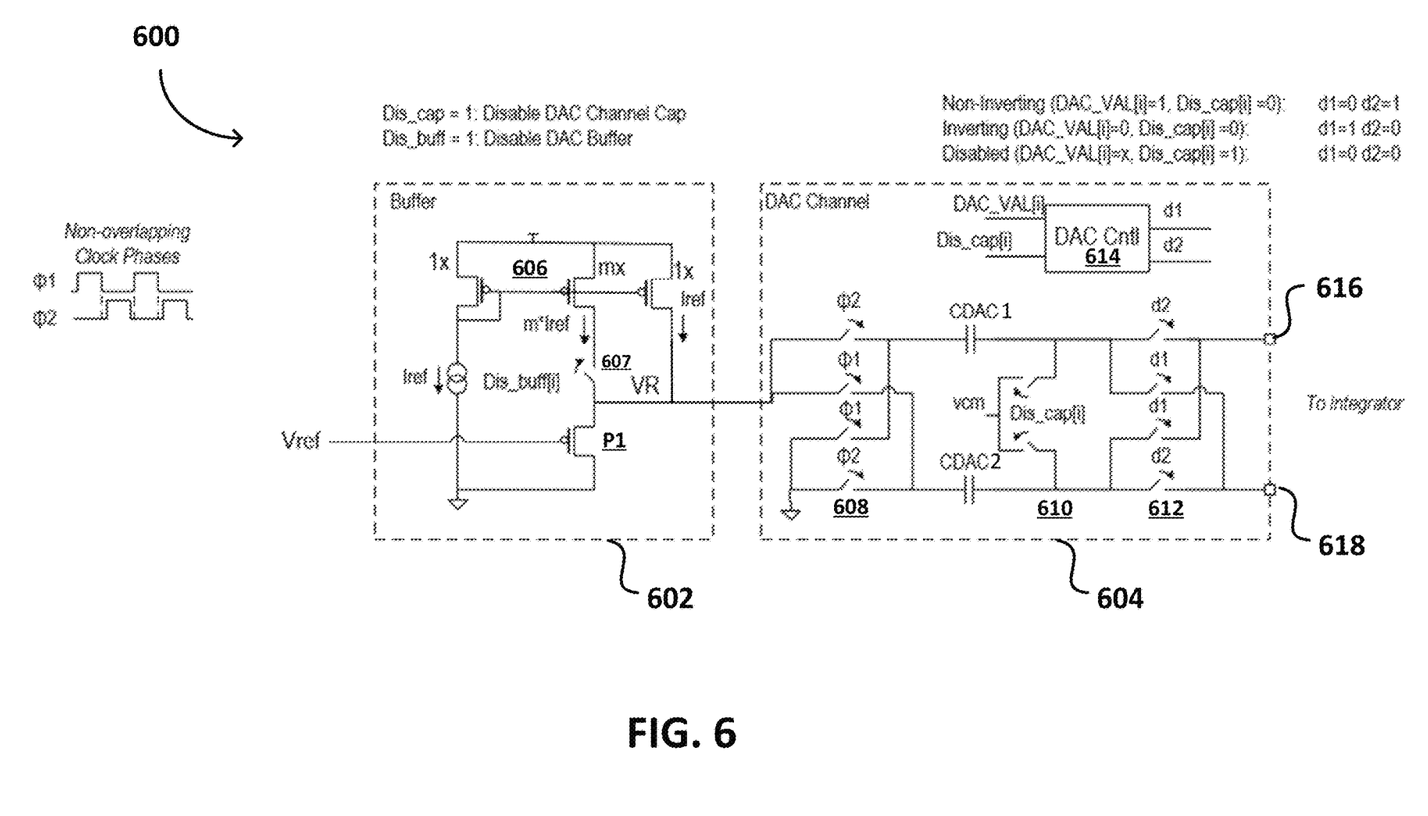
FIG. 6 is a schematic diagram of a single DAC channel, according to an embodiment.

FIG. 6 is a schematic diagram of a single DAC channel 600, according to an embodiment. Single DAC channel 600 includes a buffer 602, which corresponds to any of the buffers A1, A2, A3, . . . A13, A14, and A15 shown in FIG. 4, and DAC channel 604, which corresponds to an individual channel portion of block 414 shown in FIG. 4. Buffer 602 is coupled between a power source such as VDD, and ground, in an embodiment, and receives a Vref input voltage and provides a buffered VR output voltage. Buffer 602 comprises a PMOS current mirror 606 including a 1x sized input transistor, an mx sized output transistor, and a 1x sized output transistor. The input of current mirror 606 receives an Iref input bias current, and provides two output currents having values of m*Iref, and Iref. PMOS transistor P1, which operates as a source follower that buffers the Vref voltage, provides a current sink and is selectively coupled to receive an (m+1)*Iref output current or Iref output current from current mirror 606 depending upon the state of switch 607. Switch 607 is controlled by the Dis_buff[i] control signal. If switch 607 is closed, buffer 602 is in a normal power mode and the currents from both output transistors of current mirror 606 are sunk through PMOS transistor P1, and in switch 607 is open, buffer 602 is in a low power mode and only the smaller of the two currents provides by current mirror 606 is sunk through PMOS transistor P1. In some embodiments a single output current mirror may be used such that buffer is either completely disabled or enabled based on the state of the Dis_buff[i] control signal. In the low power mode, buffer 602 presents a "weak" reference voltage (VR) to the input of DAC channel 604.

DAC channel 604 comprises a first set of switches 608 coupled to DAC capacitors CDAC1 and CDAC2. In an embodiment, DAC capacitors CDAC1 and CDAC2 have the same capacitance value. DAC capacitors CDAC1 and CDAC2 are in turn coupled to a second set of switches 610. The second set of switches are coupled to a third set of switches 612, which are in turn coupled to circuit nodes 616 and 618. Circuit nodes 616 and 618 are coupled to an integrator as will be explained in further detail below. The first set of switches 608 is controlled by two non-overlapping clock phases $\phi 1$ and $\phi 2$ to selectively couple the VR buffered reference voltage to either DAC capacitors CDAC1 or CDAC2, or to ground. In some embodiments, the first set of switches 608 can be completely turned off, for example with one or more on-demand DAC elements. However, for the always-on DAC elements, the first set of switches are kept switching to provide a constant dynamic load at the VR node (for mismatch reasons). The second set of switches 610 is controlled by the Dis_cap[i] control signal to selectively couple the output of DAC capacitors CDAC1 and CDAC2 to a common mode voltage source vcm, or to the third set of switches 612. When the second set of switches 610 is closed, the thermal noise generated by the DAC capacitors is routed to the common mode voltage source vcm, such that the noise will not appear in the output of the ADC. When the second set of switches 610 is open, DAC channel 604 is operating in a normal mode of operation (enabled). The third set of switches is controlled by the d1 and d2 control signals to selectively couple, based on the output of the DAC, the outputs of DAC capacitors CDAC1 and CDAC2 to circuit nodes 616 and 618, respectively, or to circuit nodes 618 and 616, respectively. If the DAC capacitors are routed to the common mode voltage source vcm, then all of the switches in the third set of switches 612 are opened. Control signals d1 and d2 are generated by a DAC control block 614, which receives two input signals DAC_VAL[i] and Dis_cap[i]. The source of these input signals is explained in above with respect to the description of FIG. 5. In an embodiment, DAC control block 614 comprises either dedicated logic circuitry or software instructions for configuring a microprocessor.

Figure 7:
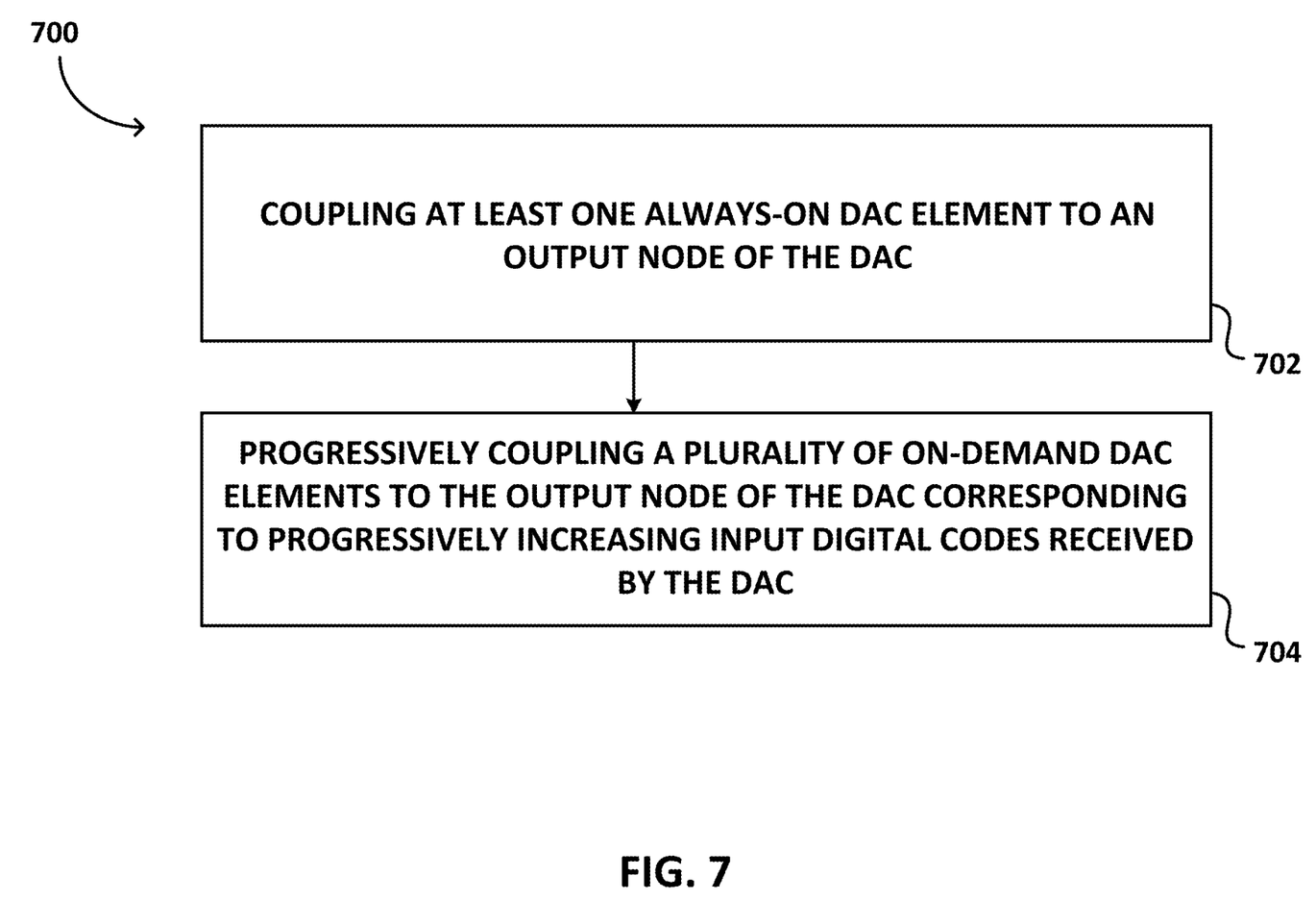
FIG. 7 is a flow chart of a method of operating a DAC, according to an embodiment.

FIG. 7 is a flow chart of a method 700 of operating a DAC, according to an embodiment, comprising coupling at least one always-on DAC element to an output node of the DAC at step 702; and progressively coupling a plurality of on-demand DAC elements to the output node of the DAC corresponding to progressively increasing input digital codes received by the DAC at step 704.

Method 700 further comprises progressively decoupling the plurality of on-demand DAC elements from a common node of the DAC in embodiments. The common node vcm is shown in FIG. 5. Decoupling DAC capacitors CDAC1 and CDAC2, previously described, requires the action of the second set of switches 510 to electrically decouple (electrically insulate) the DAC capacitors from the common node. The common node vcm is a separate node that is different from the DAC ground node, in an embodiment.

Method 700 further comprises progressively enabling a buffer of each of the plurality of on-demand DAC elements in embodiments, wherein enabling the buffer of each of the plurality of on-demand DAC elements comprises switching the buffer from an OFF mode of operation to an ON mode of operation, or wherein enabling the buffer of each of the plurality of on-demand DAC elements comprises switching the buffer from a low power mode of operation to a high (normal) power mode of operation. Switch 507, previously described and shown in FIG. 5, selectively places the buffer in the low power mode of operation or the normal mode of operation.

Example embodiments of the present invention are summarized here. Other embodiments can also be understood from the entirety of the specification and the claims filed herein.

Example 1. An analog-to-digital converter (ADC) includes a loop filter having an input for receiving an analog input signal; a quantizer having an input coupled to an output of the loop filter, and an output for providing a digital output signal; and a digital-to-analog converter (DAC) having an input coupled to an output of the quantizer, and an output coupled to the loop filter, wherein the DAC includes at least one always-on DAC element, and a plurality of on-demand DAC elements.

Example 2. The ADC of Example 1, wherein the plurality of on-demand DAC elements is configured for progressive enablement corresponding to an increase in the analog input signal.

Example 3. The ADC of any of the above examples, wherein the plurality of on-demand DAC elements includes a plurality of internally-switched buffers.

Example 4. The ADC of any of the above examples, wherein the plurality of on-demand DAC elements are selectively coupled to a common node of the DAC.

Example 5. The ADC of any of the above examples, wherein the at least one always-on DAC element includes a first buffer that is configured to remain in a first mode, and wherein each of the plurality of on-demand DAC elements includes a second buffer that is configured to be selectively switched between the first mode and a second mode.

Example 6. The ADC of any of the above examples, wherein the at least one always-on DAC element is arranged in a first portion of the DAC, and wherein the plurality of on-demand DAC elements includes a plurality of symmetrically-paired on-demand DAC elements arranged in second and third portions of the DAC adjacent to the first portion of the DAC.

Example 7. The ADC of any of the above examples, wherein the at least one always-on DAC element and each of the plurality of on-demand DAC elements include a buffer configured for receiving a reference voltage; a capacitor; a switch matrix coupled between the capacitor and the buffer.

Example 8. The ADC of any of the above examples, wherein the at least one always-on DAC element includes a plurality of always-on DAC elements, and wherein each buffer of the plurality of always-on DAC elements are coupled together.

Example 9. The ADC of any of the above examples, wherein an output of a buffer in the plurality of on-demand DAC elements is coupled to an output of a symmetrically-paired buffer in the plurality of on-demand DAC elements.

Example 10. The ADC of any of the above examples, wherein each buffer in the plurality of on-demand DAC elements includes a switch configured for selecting between two biasing currents.

Example 11. A digital-to-analog converter (DAC) include a plurality of DAC elements, wherein each DAC element has an input for receiving a digital input signal; and a switch matrix coupled to the plurality of DAC elements having an output for providing an analog output signal, wherein the plurality of DAC elements includes at least one always-on DAC element, and a plurality of on-demand DAC elements.

Example 12. The DAC of Example 11, wherein the plurality of on-demand DAC elements is configured to be progressively enabled.

Example 13. The DAC of any of the above examples, wherein each DAC element includes a buffer; and a capacitor coupled to the buffer.

Example 14. The DAC of any of the above examples, wherein the at least one always-on DAC elements includes a plurality of always-on elements, and wherein each always-on element is coupled together.

Example 15. The DAC of any of the above examples, wherein one of the plurality of on-demand DAC elements is coupled to a symmetrically-arranged on-demand DAC element.

Example 16. A method of operating a digital-to-analog converter (DAC) includes coupling at least one always-on DAC element to an output node of the DAC; and progressively coupling a plurality of on-demand DAC elements to the output node of the DAC corresponding to progressively increasing input digital codes received by the DAC.

Example 17. The method of Example 16, further comprising progressively decoupling the plurality of on-demand DAC elements from a common node of the DAC.

Example 18. The method of any of the above examples, further comprising progressively enabling a buffer of each of the plurality of on-demand DAC elements.

Example 19. The method of any of the above examples, wherein enabling the buffer of each of the plurality of on-demand DAC elements includes switching the buffer from an OFF mode of operation to an ON mode of operation.

Example 20. The method of any of the above examples, wherein enabling the buffer of each of the plurality of on-demand DAC elements includes switching the buffer from a low power mode of operation to a high power mode of operation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter (ADC) comprising:
   a loop filter having an input for receiving an analog input signal;
   a quantizer having an input coupled to an output of the loop filter, and an output for providing a digital output signal; and
   a digital-to-analog converter (DAC) having an input coupled to an output of the quantizer, and an output coupled to the loop filter, wherein the DAC comprises at least one always-on DAC element, and a plurality of on-demand DAC elements including a plurality of internally-switched buffers.

2. The ADC of claim 1, wherein the plurality of on-demand DAC elements is configured for progressive enablement corresponding to an increase in the analog input signal.

3. The ADC of claim 2, wherein the plurality of on-demand DAC elements are selectively coupled to a common node of the DAC.

4. The ADC of claim 1, wherein the at least one always-on DAC element comprises a first buffer that is configured to remain in a first mode, and wherein each of the plurality of on-demand DAC elements comprises a second buffer that is configured to be selectively switched between the first mode and a second mode.

5. The ADC of claim 1, wherein the at least one always-on DAC element is arranged in a first portion of the DAC, and wherein the plurality of on-demand DAC elements comprises a plurality of symmetrically-paired on-demand DAC elements arranged in second and third portions of the DAC adjacent to the first portion of the DAC.

6. The ADC of claim 1, wherein the at least one always-on DAC element and each of the plurality of on-demand DAC elements comprise:
   a buffer configured for receiving a reference voltage;
   a capacitor;
   a switch matrix coupled between the capacitor and the buffer.

7. The ADC of claim 6, wherein the at least one always-on DAC element comprises a plurality of always-on DAC elements, and wherein each buffer of the plurality of always-on DAC elements are coupled together.

8. The ADC of claim 6, wherein an output of a buffer in the plurality of on-demand DAC elements is coupled to an output of a symmetrically-paired buffer in the plurality of on-demand DAC elements.

9. The ADC of claim 6, wherein each buffer in the plurality of on-demand DAC elements comprises a switch configured for selecting between two biasing currents.

10. A digital-to-analog converter (DAC) comprising:
    a plurality of DAC elements, wherein each DAC element has an input for receiving a digital input signal; and
    a switch matrix coupled to the plurality of DAC elements having an output for providing an analog output signal, wherein the plurality of DAC elements comprises at least one always-on DAC element, and a plurality of on-demand DAC elements,
wherein each DAC element includes:
a buffer; and
a capacitor coupled to the buffer.

11. The DAC of claim 10, wherein the plurality of on-demand DAC elements is configured to be progressively enabled.

12. The DAC of claim 10, wherein the at least one always-on DAC elements comprises a plurality of always-on elements, and wherein each always-on element is coupled together.

13. The DAC of claim 10, wherein one of the plurality of on-demand DAC elements is coupled to a symmetrically-arranged on-demand DAC element.

14. A method of operating a digital-to-analog converter (DAC) comprising:
coupling at least one always-on DAC element to an output node of the DAC; and
progressively coupling a plurality of on-demand DAC elements to the output node of the DAC corresponding to progressively increasing input digital codes received by the DAC; and
progressively enabling a buffer of each of the plurality of on-demand DAC elements.

15. The method of claim 14, further comprising progressively decoupling the plurality of on-demand DAC elements from a common node of the DAC.

16. The method of claim 14, wherein enabling the buffer of each of the plurality of on-demand DAC elements comprises switching the buffer from an OFF mode of operation to an ON mode of operation.

17. The method of claim 14, wherein enabling the buffer of each of the plurality of on-demand DAC elements comprises switching the buffer from a low power mode of operation to a high power mode of operation.

18. An analog-to-digital converter (ADC) comprising:
a loop filter having an input for receiving an analog input signal;
a quantizer having an input coupled to an output of the loop filter, and an output for providing a digital output signal; and
a digital-to-analog converter (DAC) having an input coupled to an output of the quantizer, and an output coupled to the loop filter, wherein the DAC comprises at least one always-on DAC element, and a plurality of on-demand DAC elements, the at least one always-on DAC element and each of the plurality of on-demand DAC elements including:
a buffer configured for receiving a reference voltage;
a capacitor; and
a switch matrix coupled between the capacitor and the buffer.

* * * * *